(12) United States Patent
Chen et al.

(10) Patent No.: US 9,379,315 B2
(45) Date of Patent: Jun. 28, 2016

(54) MEMORY CELLS, METHODS OF FABRICATION, SEMICONDUCTOR DEVICE STRUCTURES, AND MEMORY SYSTEMS

(71) Applicant: Micron Technology, Inc., Boise, ID (US)

(72) Inventors: Wei Chen, White Plains, NY (US);
Sunil Murthy, White Plains, NY (US);
Witold Kula, Gilroy, CA (US)

(73) Assignee: Micron Technology, Inc., Boise, ID (US)

( * ) Notice: Subject to any disclaimer, the term of this patent is extended or adjusted under 35 U.S.C. 154(b) by 47 days.

(21) Appl. No.: 13/797,185

(22) Filed: Mar. 12, 2013

(65) Prior Publication Data

US 2014/0264663 A1 Sep. 18, 2014

(51) Int. Cl.
*G11B 5/31* (2006.01)
*H01L 43/12* (2006.01)
*H01L 43/08* (2006.01)

(52) U.S. Cl.
CPC .............. *H01L 43/12* (2013.01); *H01L 43/08* (2013.01)

(58) Field of Classification Search
CPC .................... G11B 5/3143; G11B 2005/3996; G01R 33/093
USPC ................................ 257/421; 360/313, 324.1
See application file for complete search history.

(56) References Cited

U.S. PATENT DOCUMENTS

| | | | |
|---|---|---|---|
| 4,882,936 A | 11/1989 | Garshelis | |
| 5,768,069 A * | 6/1998 | Mauri | ............................ 360/314 |
| 6,166,948 A | 12/2000 | Parkin et al. | |
| 6,258,470 B1 | 7/2001 | Sakakima et al. | |
| 6,275,363 B1 | 8/2001 | Gill | |
| 6,363,000 B2 | 3/2002 | Perner et al. | |

(Continued)

FOREIGN PATENT DOCUMENTS

| EP | 1353443 A2 | 10/2003 |
|---|---|---|
| EP | 2385548 A1 | 11/2011 |

(Continued)

OTHER PUBLICATIONS

Kim et al., Enhancement of Data Retention and Write Current Scaling for Sub-20nm STT-MRAM by Utilizing Dual Interfaces for Perpendicular Magnetic Anisotropy, VLSI Technology (VLSIT), 2012 Symposium, Jun. 12-14 2012, abstract, 1 page.

(Continued)

*Primary Examiner* — Thomas L Dickey
(74) *Attorney, Agent, or Firm* — TraskBritt

(57) ABSTRACT

Magnetic memory cells, methods of fabrication, semiconductor device structures, and memory systems are disclosed. A magnetic cell core includes at least one magnetic region (e.g., a free region or a fixed region) configured to exhibit a vertical magnetic orientation, at least one oxide-based region, which may be a tunnel junction region or an oxide capping region, and at least one magnetic interface region, which may comprise or consist of iron (Fe). In some embodiments, the magnetic interface region is spaced from at least one oxide-based region by a magnetic region. The presence of the magnetic interface region enhances the perpendicular magnetic anisotropy (PMA) strength of the magnetic cell core. In some embodiments, the PMA strength may be enhanced more than 50% compared to that of the same magnetic cell core structure lacking the magnetic interface region.

17 Claims, 5 Drawing Sheets

(56) References Cited

U.S. PATENT DOCUMENTS

| | | |
|---|---|---|
| 6,387,476 B1 | 5/2002 | Iwasaki et al. |
| 6,483,741 B1 | 11/2002 | Iwasaki et al. |
| 6,560,135 B2 | 5/2003 | Matsuoka et al. |
| 6,611,405 B1 | 8/2003 | Inomata et al. |
| 6,703,249 B2 | 3/2004 | Okazawa et al. |
| 6,771,534 B2 | 8/2004 | Stipe |
| 6,806,096 B1 | 10/2004 | Kim et al. |
| 6,845,038 B1 | 1/2005 | Shukh |
| 6,970,376 B1 | 11/2005 | Fukuzumi |
| 6,980,468 B1 | 12/2005 | Ounadjela |
| 6,992,359 B2 | 1/2006 | Nguyen et al. |
| 6,998,150 B2 | 2/2006 | Li et al. |
| 7,026,671 B2 | 4/2006 | Mizuguchi et al. |
| 7,095,933 B2 | 8/2006 | Barth |
| 7,130,167 B2 | 10/2006 | Gill |
| 7,189,583 B2 | 3/2007 | Drewes |
| 7,230,265 B2 | 6/2007 | Kaiser et al. |
| 7,239,489 B2 | 7/2007 | Lin et al. |
| 7,274,080 B1 | 9/2007 | Parkin |
| 7,372,674 B2 | 5/2008 | Gill |
| 7,378,698 B2 | 5/2008 | Ha et al. |
| 7,379,280 B2 | 5/2008 | Fukumoto et al. |
| 7,486,552 B2 | 2/2009 | Apalkov et al. |
| 7,488,609 B1 | 2/2009 | Lin et al. |
| 7,514,160 B2 | 4/2009 | Nagahama et al. |
| 7,563,486 B2 | 7/2009 | Barth |
| 7,564,152 B1 | 7/2009 | Clark et al. |
| 7,602,033 B2 | 10/2009 | Zhao et al. |
| 7,660,153 B2 | 2/2010 | Yamane et al. |
| 7,682,841 B2 | 3/2010 | Dahmani et al. |
| 7,732,881 B2 | 6/2010 | Wang |
| 7,750,421 B2 | 7/2010 | Horng et al. |
| 7,791,844 B2 | 9/2010 | Carey et al. |
| 7,835,173 B2 | 11/2010 | Ma et al. |
| 7,863,060 B2 | 1/2011 | Belen et al. |
| 7,885,105 B2 | 2/2011 | Li et al. |
| 7,919,794 B2 | 4/2011 | Gu et al. |
| 7,929,370 B2 | 4/2011 | Min |
| 7,932,572 B2 | 4/2011 | Tsujiuchi |
| 7,948,044 B2 | 5/2011 | Horng et al. |
| 8,009,465 B2 | 8/2011 | Nakayama et al. |
| 8,043,732 B2 | 10/2011 | Anderson et al. |
| 8,048,492 B2 | 11/2011 | Fukuzawa et al. |
| 8,068,317 B2 | 11/2011 | Gill |
| 8,080,432 B2 | 12/2011 | Horng et al. |
| 8,089,137 B2 | 1/2012 | Lung et al. |
| 8,102,700 B2 | 1/2012 | Liu et al. |
| 8,138,561 B2 | 3/2012 | Horng et al. |
| 8,324,697 B2 | 12/2012 | Worledge |
| 8,334,148 B2 | 12/2012 | Jeong et al. |
| 8,338,004 B2 | 12/2012 | Shin et al. |
| 8,357,962 B2 | 1/2013 | Marukame et al. |
| 8,385,107 B2 | 2/2013 | Prejbeanu |
| 8,411,498 B2 | 4/2013 | Kim et al. |
| 8,422,286 B2 | 4/2013 | Ranjan et al. |
| 8,470,462 B2 | 6/2013 | Horng et al. |
| 8,492,169 B2 | 7/2013 | Cao et al. |
| 8,570,798 B2 | 10/2013 | Meade et al. |
| 8,587,043 B2 | 11/2013 | Natori et al. |
| 8,623,452 B2 | 1/2014 | Zhou |
| 8,749,003 B2 | 6/2014 | Horng et al. |
| 8,779,538 B2 | 7/2014 | Chen et al. |
| 8,803,265 B2 | 8/2014 | Lim et al. |
| 8,823,118 B2 | 9/2014 | Horng et al. |
| 2002/0089874 A1 | 7/2002 | Nickel et al. |
| 2002/0105827 A1 | 8/2002 | Redon et al. |
| 2003/0011939 A1 | 1/2003 | Gill |
| 2003/0064569 A1 | 4/2003 | Takayama et al. |
| 2003/0103371 A1 | 6/2003 | Kim et al. |
| 2003/0199104 A1 | 10/2003 | Leuschner et al. |
| 2004/0075959 A1 | 4/2004 | Gill |
| 2004/0091744 A1 | 5/2004 | Carey et al. |
| 2004/0174740 A1 | 9/2004 | Lee et al. |
| 2004/0224243 A1 | 11/2004 | Yoshizawa et al. |
| 2004/0233760 A1 | 11/2004 | Guo et al. |
| 2005/0036361 A1 | 2/2005 | Fukuzumi |
| 2005/0068683 A1 | 3/2005 | Gill |
| 2005/0087511 A1 | 4/2005 | Sharma et al. |
| 2005/0106810 A1 | 5/2005 | Pakala et al. |
| 2005/0164414 A1 | 7/2005 | Deak |
| 2005/0173698 A1 | 8/2005 | Drewes |
| 2005/0189574 A1 | 9/2005 | Nguyen et al. |
| 2005/0211973 A1 | 9/2005 | Mori et al. |
| 2006/0038213 A1 | 2/2006 | Mori et al. |
| 2006/0042930 A1 | 3/2006 | Mauri |
| 2006/0114714 A1 | 6/2006 | Kanegae |
| 2006/0118842 A1 | 6/2006 | Iwata |
| 2006/0261425 A1 | 11/2006 | Suemitsu et al. |
| 2007/0008661 A1 | 1/2007 | Min et al. |
| 2007/0035890 A1 | 2/2007 | Sbiaa |
| 2007/0053112 A1* | 3/2007 | Papworth Parkin ... B82Y 10/00 360/324.2 |
| 2007/0086121 A1 | 4/2007 | Nagase et al. |
| 2007/0217071 A1 | 9/2007 | Inamura et al. |
| 2007/0297220 A1 | 12/2007 | Yoshikawa et al. |
| 2008/0164502 A1 | 7/2008 | Fukumoto et al. |
| 2008/0164548 A1 | 7/2008 | Ranjan et al. |
| 2008/0179699 A1 | 7/2008 | Horng et al. |
| 2008/0205130 A1 | 8/2008 | Sun et al. |
| 2008/0225581 A1 | 9/2008 | Yamane et al. |
| 2008/0278867 A1 | 11/2008 | Fukumoto et al. |
| 2009/0039450 A1 | 2/2009 | Lee et al. |
| 2009/0079018 A1 | 3/2009 | Nagase et al. |
| 2009/0096043 A1 | 4/2009 | Min et al. |
| 2009/0108383 A1 | 4/2009 | Horng et al. |
| 2009/0190262 A1* | 7/2009 | Murakami et al. ......... 360/245.3 |
| 2009/0229111 A1 | 9/2009 | Zhao et al. |
| 2009/0257151 A1 | 10/2009 | Zhang et al. |
| 2010/0034014 A1 | 2/2010 | Ohno et al. |
| 2010/0080036 A1 | 4/2010 | Liu et al. |
| 2010/0080048 A1 | 4/2010 | Liu et al. |
| 2010/0096716 A1* | 4/2010 | Ranjan .................. B82Y 10/00 257/421 |
| 2010/0102406 A1 | 4/2010 | Xi et al. |
| 2010/0109110 A1 | 5/2010 | Wang et al. |
| 2010/0110783 A1 | 5/2010 | Liu et al. |
| 2010/0148167 A1 | 6/2010 | Whig et al. |
| 2010/0171086 A1 | 7/2010 | Lung et al. |
| 2010/0176472 A1 | 7/2010 | Shoji |
| 2010/0177557 A1 | 7/2010 | Liu et al. |
| 2010/0177561 A1 | 7/2010 | Liu et al. |
| 2010/0200899 A1 | 8/2010 | Marukame et al. |
| 2010/0230769 A1 | 9/2010 | Ozaki et al. |
| 2010/0240151 A1 | 9/2010 | Belen et al. |
| 2010/0327248 A1 | 12/2010 | Khoueir et al. |
| 2011/0007429 A1 | 1/2011 | Dimitrov et al. |
| 2011/0007543 A1 | 1/2011 | Khoury |
| 2011/0014500 A1 | 1/2011 | Horng et al. |
| 2011/0031569 A1 | 2/2011 | Watts et al. |
| 2011/0049657 A1 | 3/2011 | Tsukamoto et al. |
| 2011/0049658 A1 | 3/2011 | Zheng et al. |
| 2011/0051503 A1* | 3/2011 | Hu et al. ...................... 365/158 |
| 2011/0062537 A1 | 3/2011 | Oh et al. |
| 2011/0064969 A1* | 3/2011 | Chen ..................... B82Y 25/00 428/800 |
| 2011/0096443 A1 | 4/2011 | Zhang et al. |
| 2011/0121366 A1 | 5/2011 | Or-Bach et al. |
| 2011/0145514 A1 | 6/2011 | Lee et al. |
| 2011/0149646 A1 | 6/2011 | Liu et al. |
| 2011/0149647 A1 | 6/2011 | Kim et al. |
| 2011/0149670 A1 | 6/2011 | Heo et al. |
| 2011/0170339 A1 | 7/2011 | Wunderlich et al. |
| 2011/0170341 A1 | 7/2011 | Butler |
| 2011/0241138 A1 | 10/2011 | Hsieh et al. |
| 2011/0260274 A1 | 10/2011 | Zheng et al. |
| 2011/0266642 A1 | 11/2011 | Viala et al. |
| 2011/0269251 A1 | 11/2011 | Kim et al. |
| 2011/0293967 A1 | 12/2011 | Zhang et al. |
| 2011/0303995 A1 | 12/2011 | Worledge |
| 2011/0303997 A1 | 12/2011 | Wang et al. |
| 2011/0309418 A1 | 12/2011 | Nakayama et al. |
| 2012/0012952 A1 | 1/2012 | Chen et al. |
| 2012/0012953 A1 | 1/2012 | Lottis et al. |
| 2012/0012954 A1 | 1/2012 | Yamada et al. |

(56) References Cited

U.S. PATENT DOCUMENTS

| | | | |
|---|---|---|---|
| 2012/0015099 A1 | 1/2012 | Sun et al. |
| 2012/0018823 A1 | 1/2012 | Huai et al. |
| 2012/0040207 A1 | 2/2012 | Horng et al. |
| 2012/0069647 A1 | 3/2012 | Kramer et al. |
| 2012/0074511 A1 | 3/2012 | Takahashi et al. |
| 2012/0075922 A1 | 3/2012 | Yamada et al. |
| 2012/0075927 A1 | 3/2012 | Chen et al. |
| 2012/0106233 A1 | 5/2012 | Katti |
| 2012/0134201 A1 | 5/2012 | Ogimoto |
| 2012/0135273 A1 | 5/2012 | Horng et al. |
| 2012/0146167 A1 | 6/2012 | Huai et al. |
| 2012/0155156 A1 | 6/2012 | Watts et al. |
| 2012/0205758 A1* | 8/2012 | Jan et al. ............ 257/421 |
| 2012/0217594 A1 | 8/2012 | Kajiyama |
| 2012/0218813 A1 | 8/2012 | Oh et al. |
| 2012/0225499 A1 | 9/2012 | Nozieres et al. |
| 2012/0236631 A1 | 9/2012 | Park et al. |
| 2012/0241878 A1 | 9/2012 | Hu et al. |
| 2012/0267733 A1 | 10/2012 | Hu et al. |
| 2012/0280336 A1 | 11/2012 | Jan et al. |
| 2012/0286382 A1 | 11/2012 | Jan et al. |
| 2012/0299134 A1 | 11/2012 | Jan et al. |
| 2012/0299137 A1 | 11/2012 | Worledge |
| 2013/0005052 A1 | 1/2013 | Hu et al. |
| 2013/0028013 A1 | 1/2013 | Ikeda et al. |
| 2013/0042081 A1 | 2/2013 | Park et al. |
| 2013/0059168 A1 | 3/2013 | Tahmasebi et al. |
| 2013/0064011 A1 | 3/2013 | Liu et al. |
| 2013/0069185 A1 | 3/2013 | Saida et al. |
| 2013/0140658 A1 | 6/2013 | Yamane et al. |
| 2013/0146996 A1 | 6/2013 | Yu et al. |
| 2013/0228884 A1 | 9/2013 | Zheng et al. |
| 2013/0229866 A1 | 9/2013 | Ranjan et al. |
| 2013/0250661 A1 | 9/2013 | Sandhu et al. |
| 2013/0313665 A1 | 11/2013 | Rhie et al. |
| 2013/0334630 A1 | 12/2013 | Kula et al. |
| 2013/0334631 A1 | 12/2013 | Kinney et al. |
| 2014/0099735 A1 | 4/2014 | Horng et al. |

FOREIGN PATENT DOCUMENTS

| | | | |
|---|---|---|---|
| EP | 2541554 A1 | 1/2013 |
| EP | 2015307 B1 | 4/2013 |
| GB | 2343308 A | 5/2000 |
| JP | 2002314049 A | 10/2002 |
| JP | 2004104076 A | 4/2004 |
| JP | 2009194366 A | 8/2009 |
| KR | 1020040092342 A | 11/2004 |
| KR | 1020070094431 A | 9/2007 |
| KR | 1020080029852 A | 4/2008 |
| KR | 1020120008295 A | 1/2012 |
| WO | 2010026831 A1 | 3/2010 |
| WO | 2010134378 A1 | 11/2010 |
| WO | 2011001746 A1 | 1/2011 |
| WO | 2011149274 A2 | 12/2011 |
| WO | 2011159422 A1 | 12/2011 |
| WO | 2012128891 A1 | 9/2012 |
| WO | 2012160937 A1 | 11/2012 |

OTHER PUBLICATIONS

Written Opinion of the International Searching Authority for PCT/US2014/022555, (dated Jul. 21, 2014), 8 pages.
International Search Report for PCT/US2014/022555, (dated Jul. 21, 2014), 3 pages.
You et al., Spin Transfer Torque and Tunneling Magnetoresistance Dependences on Finite Bias Voltages and Insulator Barrier Energy, Thin Solid Films, vol. 519, (2011), pp. 8247-8251.
Yu et al., 1/f Noise in MgO Double-Barrier Magnetic Tunnel Junctions, Applied Physics Letters, vol. 98, (2011), pp. 112504-1-112504-3.
Zhang, Anisotropic Magnetomechanical Effect in Tb0.3Dy0.7Fe2 Alloy, Journal of Magnetism and Magnetic Materials, vol. 324, (2012), pp. 190-195.
Zhu et al., Magnetic Tunnel Junctions, MaterialsToday, vol. 9, No. 11, (Nov. 2006), pp. 36-45.
Apalkov et al., Comparison of Scaling of In-Plane and Perpendicular Spin Transfer Switching Technologies by Micromagnetic Simulation, IEEE Transactions on Magnetics, vol. 46, Issue 6, (Jun. 2010), pp. 2240-2243 (abstract only).
Auwarter et al., Co on h-BN/Ni(1 1 1): From Island to Island-Chain Formation and Co Intercalation, Surface Science, vol. 511, (2002), pp. 379-386.
Bai et al., Boron Diffusion Induced Symmetry Reduction and Scattering in CoFeB/MgO/CoFeB Magnetic Tunnel Junctions, Phys. Rev. B, vol. 87, (Jan. 23, 2013), pp. 014114 (abstract only).
Braun et al., Strain-Induced Perpendicular Magnetic Anisotropy in Ultrathin Ni Films on Cu3Au(0 0 1), Journal of Magnetism and Magnetic Materials, vol. 171, (1997), pp. 16-28.
Carrey et al., Influence of Interface Alloying on the Magnetic Properties of Co/Pd Multilayers, Applied Physics Letters, vol. 83, No. 25, (Dec. 22, 2003), pp. 5259-5261.
Cha et al, Atomic-Scale Spectroscopic Imaging of CoFeB/Mg-B-O/CoFeB Magnetic Tunnel Junctions, Applied Physics Letters, vol. 95, (2009), pp. 032506-1-032506-3.
Chen et al., Advances and Future Prospects of Spin-Transfer Torque Random Access Memory, IEEE Transactions on Magnetics, vol. 26, No. 6, (Jun. 2010), pp. 1873-1878.
Diao et al., Spin Transfer Switching in Dual MgO Magnetic Tunnel Junctions, Applied Physics Letters, vol. 90, (2007), pp. 132508-1-132508-3.
Djayaprawira et al., 230% Room-Temperature Magnetoresistance in CoFeB/MgO/CoFeB Magnetic Tunnel Junctions, Applied Physics Letters, vol. 86, Issue 9, (2005), 2 pages, (abstract only).
Farle et al., The Temperature Dependence of Magnetic Anisotropy in Ultra-Thin Films, Journal of Magnetism and Magnetic Materials, vol. 165, (1997), pp. 74-77.
Gan et al., Origin of the Collapse of Tunnel Magnetoresistance at High Annealing Temperature in CoFeB/MgO Perpendicular Magnetic Tunnel Junctions, Applied Physics Letters, vol. 99, (2011), pp. 252507-1-252507-3.
Gao et al., Combinatorial Exploration of Rare-Earth-Free Permanent Magnets: Magnetic and Microstructural Properties of Fe-Co-W Thin Films, Applied Physics Letters, vol. 102, (2013), pp. 022419-1-022419-4.
Hayakawa et al., Dependence of Giant Tunnel Magnetoresistance of Sputtered CoFeB/MgO/CoFeB Magnetic Tunnel Junctions on MgO Barrier Thickness and Annealing Temperature, Japanese Journal of Applied Physics, vol. 44, No. 19, (2005), pp. L587-L589.
Heczko et al., Strain and Concurrent Magnetization Changes in Magnetic Shape Memory Ni-Mn-Ga Single Crystals—Experiment and Model, Materials Science and Engineering A, vol. 481-482, (2008), pp. 283-287.
Hendrych et al., Magnetic Behavior and Domain Structure in As-Quenched, Annealed, and Stress-Annealed CoFeCrSiB Ribbons, Journal of Magnetism and Magnetic Materials, vol. 321, (2009), pp. 3771-3777.
Ikeda et al., Tunnel Magnetoresistance of 604% at 300 K by Suppression of Ta Diffusion in CoFeB/MgO/CoFeB Pseudo-Spin-Valves Annealed at High Temperature, Applied Physics Letters, vol. 93, (2008), pp. 082508-1-082508-3.
Ke et al., Oxygen-Vacancy-Induced Diffusive Scattering in Fe/MgO/Fe Magnetic Tunnel Junctions, Physical Review Letters, vol. 105, (Nov. 30, 2010), pp. 236801-1-236801-4.
Kim et al., Effect of Annealing on Magnetic Exchange Coupling in CoPt/Co Bilayer Thin Films, Journal of Applied Physics, vol. 87, No. 9, (May 1, 2000), pp. 6140-6142.
Ko et al., Effects of MgO and MgO/Pd Seed-Layers on Perpendicular Magnetic Anisotropy of CoPd Thin Films, Thin Solid Films, vol. 519, (2011), pp. 8252-8255.
Kohda et al., Width and Temperature Dependence of Lithography-Induced Magnetic Anisotropy in (Ga,Mn)As Wires, Physica E, vol. 42, (2010), pp. 2685-2689.
Kula et al., Memory Cells, Methods of Fabrication, Semiconductor Device Structures, Memory Systems, and Electronic Systems, U.S. Appl. No. 13/948,839, filed Jul. 23, 2014.

(56) References Cited

OTHER PUBLICATIONS

Lavrijsen et al., Tuning the Interlayer Exchange Coupling Between Single Perpendicularly Magnetized CoFeB Layers, Appl. Phys. Lett., vol. 100, (2012), pp. 052411-1-052411-5.

Löhndorf et al., Characterization of Magnetostrictive TMR Pressure Sensors by MOKE, Journal of Magnetism and Magnetic Materials, vol. 316, (2007), pp. e223-e225.

Ma et al., NiO-Thickness Dependent Magnetic Anisotropies in Fe/NiO/Au(001) and Fe/NiO/MgO(001) Systems, Journal of Magnetism and Magnetic Materials, vol. 324, (2012), pp. 528-533.

Maehara et al., Tunnel Magnetoresistance Above 170% and Resistance-Area Product of 1 Ω (μm)2 Attained by In Situ Annealing of Ultra-Thin MgO Tunnel Barrier, Applied Physics Express, vol. 4, (2011), 2 pages, (abstract only).

Matsumoto et al., Dependence on Annealing Temperatures of Tunneling Spectra in High-Resistance CoFeB/MgO/CoFeB Magnetic Tunnel Junctions, Solid State Communications, vol. 143, (2007), pp. 574-578.

Matsumoto et al., Tunneling Spectra of Sputter-Deposited CoFeB/MgO/CoFeB Magnetic Tunnel Junctions Showing Giant Tunneling Magnetoresistance Effect, Solid State Communications, vol. 136, (2005), pp. 611-615.

Miao et al., Disturbance of Tunneling Coherence by Oxygen Vacancy in Epitaxial Fe/MgO/Fe Magnetic Tunnel Junctions, Physical Review Letters, vol. 100, (Jun. 19, 2008), pp. 246803-1-246803-4.

Miracle et al., An Assessment of Binary Metallic Glasses: Correlations Between Structure, Glass Forming Ability and Stability (Preprint), Air Force Research Laboratory, (2011), 97 pages.

Miura et al., CoFeB/MgO Based Perpendicular Magnetic Tunnel Junctions with Stepped Structure for Symmetrizing Different Retention Times of "0" and "1" Information, 2011 Symposium on VLSI Technology (VLSIT), (Jun. 14-16, 2011), 19 pages.

Moroz et al., Modeling the Impact of Stress on Silicon Processes and Devices, Materials Science in Semiconductor Processing, vol. 6, (2003), pp. 27-36.

Moutis et al., Voltage-Induced Modification in Magnetic Coercivity of Patterned Co50Fe50 Thin Film on Piezoelectric Substrate, Journal of Magnetism and Magnetic Materials, vol. 320, (2008), pp. 1050-1055.

Nishitani et al., Magnetic Anisotropy in a Ferromagnetic (Ga,Mn)Sb Thin Film, Physica E, vol. 42, (2010), pp. 2681-2684.

Piramanayagam, S. N., Perpendicular Recording Media for Hard Disk Drives, Journal of Applied Physics, vol. 102, (2007), pp. 011301-1-011301-22.

Resnik et al., Mechanical Stress in Thin Film Microstructures on Silicon Substrate, Vacuum, vol. 80, (2005), pp. 236-240.

Rodmacq et al., Influence of Thermal Annealing on the Perpendicular Magnetic Anisotropy of Pt/Co/AlOx Trilayers, Physical Review B, vol. 79, (2009), pp. 024423-1-024423-8.

Sandhu et al., Memory Cells, Methods of Fabrication, Semiconductor Devices, Memory Systems, and Electronic Systems, U.S. Appl. No. 14/026,627, filed Sep. 13, 2013.

Sandhu et al., Memory Cells, Semiconductor Structures, Semiconductor Devices, and Methods of Fabrication, U.S. Appl. No. 14/249,183, filed Apr. 9, 2014.

Sato et al., Perpendicular-Anisotropy CoFeB-MgO Magnetic Tunnel Junctions with a MgO/CoFeB/Ta/CoFeB/MgO Recording Structure, Applied Physics Letters, vol. 101, (2012), pp. 022414-1-022414-4.

Siddik et al., Memory Cells, Methods of Fabrication, and Semiconductor Devices, U.S. Appl. No. 14/193,979, filed Feb. 28, 2014.

Siddik et al., Memory Cells, Methods of Fabrication, and Semiconductor Devices, U.S. Appl. No. 14/030,763, filed Sep. 18, 2013.

Stone et al., Tuning of Ferromagnetism Through Anion Substitution in Ga-Mn-Pnictide Ferromagnetic Semiconductors, Physica B, vol. 401-402, (2007), pp. 454-457.

Tao et al., Uniform Wafer-Scale Chemical Vapor Deposition of Graphene on Evaporated Cu (1 1 1) Film with Quality Comparable to Exfoliated Monolayer, J. Physical Chemistry, vol. 116, (2012), pp. 24068-24074.

Vitos et al., The Surface Energy of Metals, Surface Science, vol. 411, (1998), pp. 186-202.

Wang et al., Exchange Coupling Between Ferromagnetic and Antiferromagnetic Layers Via Ru and Application for a Linear Magnetic Field Sensor, Journal of Applied Physics, vol. 99, (2006), pp. 08H703-1-08H703-3.

Wang et al., C-Spin Kickoff Meeting Presentation, Semiconductor Research Corp., (Mar. 26, 2013), Minneapolis, Minnesota, (available at https://www.src.org/library/publication/p066203/), 195 pages.

Wilson et al., New Materials for Micro-Scale Sensors and Actuators: An Engineering Review, Materials Science and Engineering R, vol. 56, (2007), pp. 1-129.

Worledge et al., Magnetoresistance Measurement of Unpatterned Magnetic Tunnel Junction Wafers by Current-in-Plane Tunneling, Applied Physics Letters, vol. 83, No. 1, (Jul. 7, 2013), pp. 84-86.

Worledge et al., Spin Torque Switching of Perpendicular Ta|CoFeB|MgO-Based Magnetic Tunnel Junctions, Applied Physics Letters, vol. 98, (2011), pp. 022501-1-022501-3.

Wu et al., Tuning Magnetic Anisotropies of Fe Films on Si(111) Substrate Via Direction Variation of Heating Current, Scientific Reports, vol. 3, (Mar. 26, 2013), pp. 1-5.

\* cited by examiner

MEMORY CELLS, METHODS OF FABRICATION, SEMICONDUCTOR DEVICE STRUCTURES, AND MEMORY SYSTEMS

TECHNICAL FIELD

The present disclosure, in various embodiments, relates generally to the field of memory device design and fabrication. More particularly, this disclosure relates to design and fabrication of memory cells characterized as spin torque transfer magnetic random access memory (STT-MRAM) cells.

BACKGROUND

Magnetic Random Access Memory (MRAM) is a non-volatile computer memory technology based on magnetoresistance. One type of MRAM cell is a spin torque transfer MRAM (STT-MRAM) cell, which includes a magnetic cell core supported by a substrate. The magnetic cell core includes at least two magnetic regions, for example, a "fixed region" and a "free region," with a non-magnetic region in-between. The fixed region includes a magnetic material that has a fixed (e.g., a non-switchable) magnetic orientation, while the free region includes a magnetic material that has a magnetic orientation that may be switched, during operation of the cell, between a "parallel" configuration, in which the magnetic orientation of the fixed region and the magnetic orientation of the free region are directed in the same direction (e.g., north and north, east and east, south and south, or west and west, respectively), and an "anti-parallel" configuration, in which the magnetic orientation of the fixed region and the magnetic orientation of the free region are directed in opposite directions (e.g., north and south, east and west, south and north, or west and east, respectively).

In the parallel configuration the STT-MRAM cell exhibits a lower electrical resistance across the magnetoresistive elements, i.e., the fixed region and free region. This state of relatively low electrical resistance may be defined as a "0" state of the MRAM cell. In the anti-parallel configuration, the STT-MRAM cell exhibits a higher electrical resistance across the magnetoresistive elements, i.e., the regions of magnetic material, e.g., the fixed region and free region. This state of relatively high electrical resistance may be defined as a "1" state of the MRAM cell. Switching of the magnetic orientation of the free region and the resulting high or low resistance states across the magnetoresistive elements enables the write and read operations of the conventional MRAM cell. Ideally, the amount of programming current required to switch the free region from the parallel configuration to the anti-parallel configuration is essentially the same amount of programming current required to switch from the anti-parallel configuration to the parallel configuration. Such equal programming current for switching is referred to herein as "symmetric switching."

The free regions and fixed regions of STT-MRAM cells may exhibit magnetic orientations that are either horizontally oriented ("in-plane") or perpendicularly oriented ("out-of-plane") with the width of the regions. In STT-MRAM cells that have perpendicularly-oriented magnetic regions, the magnetic materials exhibiting the vertical magnetic orientation may be characterized by a strength of the magnetic materials' perpendicular magnetic anisotropy ("PMA"). The strength (also referred to herein as the "magnetic strength" or the "PMA strength") is an indication of the magnetic materials' resistance to alteration of the magnetic orientation. A magnetic material exhibiting a vertical magnetic orientation with a high PMA strength may be less prone to alteration of its magnetic orientation out of the vertical orientation than a magnetic material exhibiting a vertical magnetic orientation with a lower magnetic strength. However, achieving a high PMA strength may not be sufficient, in and of itself, for successful STT-MRAM cell operation. For example, a low resistance-area (RA), a low switching current, a low switching voltage, and symmetric switching may also contribute to successful operation of an STT-MRAM cell. However, finding materials and designs in which a high PMA strength is exhibited without adversely affecting the other characteristics of the STT-MRAM cell's operation, particularly the RA of the cell, may present a challenge.

DETAILED DESCRIPTION

Figure 1:
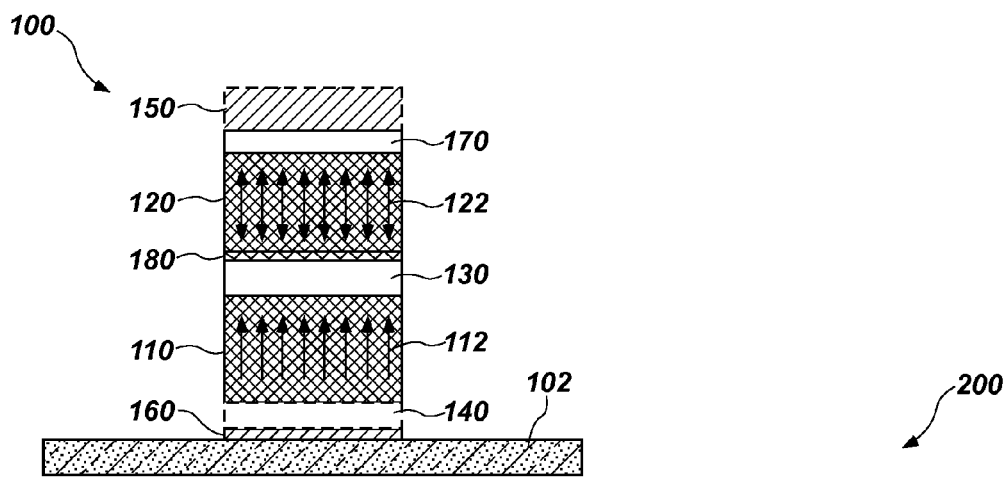
FIG. 1 is a cross-sectional, elevational, schematic illustration of a magnetic cell core of an STT-MRAM cell including a magnetic interface region disposed directly between a free region and a magnetic tunnel junction region.

Memory cells, semiconductor device structures including such memory cells, memory systems, and methods of forming such memory cells are disclosed. The memory cells include a magnetic region, such as a free region or a fixed region, exhibiting a vertical magnetic orientation. The memory cells also include at least one oxide region, such one or more of an oxide-based magnetic tunnel junction ("MTJ") region and an oxide capping region. Disposed, directly or indirectly, between the magnetic region and the oxide region is a magnetic interface region that is configured to increase the PMA strength of the memory cell, compared to memory cells lacking the magnetic interface region, but without significantly adversely affecting other characteristics of the memory cell, such as the resistance-area of the memory cell. For example, a low RA (e.g., less than about $20\Omega \cdot \mu m^2$ (Ohms×microns squared)) may be maintained even with enhanced PMA strength (e.g., a uniaxial anisotropy field ($H_k$) exceeding about 4,000 Oe (Oersted)). Accordingly, the magnetic interface region may enhance operational performance of the magnetic region (e.g., the free region or the fixed region) within a magnetic memory cell structure that accommodates high data retention time and low power operation.

As used herein, the term "substrate" means and includes a base material or other construction upon which components, such as those within memory cells, are formed. The substrate may be a semiconductor substrate, a base semiconductor material on a supporting structure, a metal electrode, or a semiconductor substrate having one or more materials, structures, or regions formed thereon. The substrate may be a conventional silicon substrate or other bulk substrate including a semiconductive material. As used herein, the term "bulk substrate" means and includes not only silicon wafers, but also silicon-on-insulator ("SOI") substrates, such as silicon-on-sapphire ("SOS") substrates or silicon-on-glass ("SOG") substrates, epitaxial layers of silicon on a base semiconductor foundation, or other semiconductor or optoelectronic materials, such as silicon-germanium ($Si_{1-x}Ge_x$, where x is, for example, a mole fraction between 0.2 and 0.8), germanium (Ge), gallium arsenide (GaAs), gallium nitride (GaN), or indium phosphide (InP), among others. Furthermore, when reference is made to a "substrate" in the following description, previous process stages may have been utilized to form materials, regions, or junctions in the base semiconductor structure or foundation.

As used herein, the term "STT-MRAM cell" means and includes: a magnetic cell structure that includes a non-magnetic region disposed between a free region and a fixed region. The non-magnetic region may be an electrically insulative (e.g., dielectric) region, in a magnetic tunnel junction ("MTJ") configuration. Alternatively, the non-magnetic region may be an electrically conductive region, in a spin-valve configuration.

As used herein, the term "cell core" means and includes a memory cell structure comprising the free region and fixed region and through which, during use and operation of the memory cell, current flows to effect a parallel or anti-parallel magnetic orientation within the free region.

As used herein, the term "vertical" means and includes a direction that is perpendicular to the width and length of the respective region. "Vertical" may also mean and include a direction that is perpendicular to a primary surface of the substrate on which the STT-MRAM cell is located.

As used herein, the term "horizontal" means and includes a direction that is parallel to at least one of the width and length of the respective region. "Horizontal" may also mean and include a direction that is parallel to a primary surface of the substrate on which the STT-MRAM cell is located.

As used herein, the term "magnetic material" means and includes ferromagnetic materials, ferrimagnetic materials, and antiferromagnetic materials.

As used herein, the term "iron-based material" means and includes a material that includes iron. For example, and without limitation, iron-based materials include pure iron, an iron alloy, and materials including cobalt and iron. The composition of the iron-based material may be altered due to annealing of the iron-based material during fabrication of the magnetic memory cell, but such material may, nonetheless, be referred to herein as an "iron-based material."

As used herein, the term "magnetic region" means a region that exhibits magnetism. A magnetic region includes a magnetic material and may also include one or more non-magnetic materials.

As used herein, the term "sub-region," means and includes a region included in another region. Thus, one magnetic region may include one or more magnetic sub-regions, i.e., sub-regions of magnetic material, as well as non-magnetic sub-regions, i.e., sub-regions of non-magnetic material.

As used herein, the term "fixed region" means and includes a magnetic region within the STT-MRAM cell that includes magnetic material and that has a fixed magnetic orientation during use and operation of the STT-MRAM cell in that a current or applied field effecting a change in the magnetization direction of one magnetic region, e.g., the free region, of the cell core may not effect a change in the magnetization direction of the fixed region. The fixed region may include one or more magnetic materials and, optionally, one or more non-magnetic materials. For example, the fixed region may be configured as a synthetic antiferromagnet (SAF) including a sub-region of ruthenium (Ru) adjoined by magnetic sub-regions. Each of the magnetic sub-regions may include one or more materials and one or more regions therein. As another example, the fixed region may be configured as a single, homogenous magnetic material. Accordingly, the fixed region may have uniform magnetization or sub-regions of differing magnetization that, overall, effect the fixed region having a fixed magnetic orientation during use and operation of the STT-MRAM cell.

As used herein, the term "free region" means and includes a magnetic region within the STT-MRAM cell that includes magnetic material and that has a switchable magnetic orientation during use and operation of the STT-MRAM cell. The magnetic orientation may be switched between a "parallel" direction, in which the magnetic orientation exhibited by the free region and the magnetic orientation exhibited by the fixed region are oriented in the same direction, and an "anti-parallel" direction, in which the magnetic orientation exhibited by the free region and the magnetic orientation exhibited by the fixed region are oriented in opposite directions from one another.

As used herein, the term "oxide region" means and includes a region within the STT-MRAM cell that includes an oxide material. For example, and without limitation, an oxide region may include an oxide-based MTJ region, an oxide capping region, or both.

As used herein, the term "between" is a spatially relative term used to describe the relative disposition of one material, region, or sub-region relative to at least two other materials, regions, or sub-regions. The term "between" can encompass both a disposition of one material, region, or sub-region directly adjacent to the other materials, regions, or sub-regions and a disposition of one material, region, or sub-region not directly adjacent to the other materials, regions, or sub-regions.

As used herein, reference to an element as being "on" or "over" another element means and includes the element being directly on top of, adjacent to, underneath, or in direct contact with the other element. It also includes the element being indirectly on top of, adjacent to, underneath, or near the other element, with other elements present therebetween. In contrast, when an element is referred to as being "directly on" or "directly adjacent to" another element, there are no intervening elements present.

As used herein, other spatially relative terms, such as "beneath," "below," "lower," "bottom," "above," "upper," "top," "front," "rear," "left," "right," and the like, may be used for ease of description to describe one element's or feature's relationship to another element(s) or feature(s) as illustrated in the figures. Unless otherwise specified, the spatially relative terms are intended to encompass different orientations of the materials in addition to the orientation as depicted in the figures. For example, if materials in the figures are inverted, elements described as "below" or "beneath" or "under" or "on bottom of" other elements or features would then be oriented "above" or "on top of" the other elements or features. Thus, the term "below" can encompass both an orientation of above and below, depending on the context in which the term is used, which will be evident to one of ordinary skill in the art. The materials may be otherwise oriented (rotated 90 degrees, inverted, etc.) and the spatially relative descriptors used herein interpreted accordingly.

As used herein, the terms "comprises," "comprising," "includes," and/or "including" specify the presence of stated features, regions, integers, stages, operations, elements, materials, components, and/or groups, but do not preclude the presence or addition of one or more other features, regions, integers, stages, operations, elements, materials, components, and/or groups thereof.

As used herein, "and/or" includes any and all combinations of one or more of the associated listed items.

As used herein, the singular forms "a," "an," and "the" are intended to include the plural forms as well, unless the context clearly indicates otherwise.

The illustrations presented herein are not meant to be actual views of any particular component, structure, device, or system, but are merely idealized representations that are employed to describe embodiments of the present disclosure.

Embodiments are described herein with reference to cross-sectional illustrations that are schematic illustrations. Accordingly, variations from the shapes of the illustrations as a result, for example, of manufacturing techniques and/or tolerances, are to be expected. Thus, embodiments described herein are not to be construed as limited to the particular shapes or regions as illustrated, but include deviations in shapes that result, for example, from manufacturing. For example, a region illustrated or described as box-shaped may have rough and/or nonlinear features. Moreover, sharp angles that are illustrated may be rounded. Thus, the materials, features, and regions illustrated in the figures are schematic in nature, and their shapes are not intended to illustrate the precise shape of a material, feature, or region and do not limit the scope of the present claims.

The following description provides specific details, such as material types and processing conditions, in order to provide a thorough description of embodiments of the disclosed devices and methods. However, a person of ordinary skill in the art will understand that the embodiments of the devices and methods may be practiced without employing these specific details. Indeed, the embodiments of the devices and methods may be practiced in conjunction with conventional semiconductor fabrication techniques employed in the industry.

The fabrication processes described herein do not form a complete process flow for processing semiconductor device structures. The remainder of the process flow is known to those of ordinary skill in the art. Accordingly, only the methods and semiconductor device structures necessary to understand embodiments of the present devices and methods are described herein.

Unless the context indicates otherwise, the materials described herein may be formed by any suitable technique including, but not limited to, spin coating, blanket coating, chemical vapor deposition ("CVD"), atomic layer deposition ("ALD"), plasma enhanced ALD, or physical vapor deposition ("PVD"). Alternatively, the materials may be grown in situ. Depending on the specific material to be formed, the technique for depositing or growing the material may be selected by a person of ordinary skill in the art.

Unless the context indicates otherwise, the removal of materials described herein may be accomplished by any suitable technique including, but not limited to, etching, ion milling, abrasive planarization, or other known methods.

Reference will now be made to the drawings, where like numerals refer to like components throughout. The drawings are not necessarily drawn to scale.

A memory cell is disclosed. The memory cell includes at least one magnetic region (e.g., a free region or a fixed region) exhibiting a vertical magnetic orientation and an oxide region (e.g., an MTJ region or an oxide capping region) with a magnetic interface region disposed, directly or indirectly, therebetween. The magnetic interface region may enhance the PMA strength of the magnetic memory cell. The magnetic interface region may be disposed adjacent to or within its respective magnetic region. In some embodiments, the memory cell may include only one magnetic interface region; however, in other embodiments, more than one magnetic interface region may be included in the memory cell.

FIG. 1 illustrates a magnetic cell core 100 of an STT-MRAM cell according to an embodiment of the present disclosure. The magnetic cell core 100 is supported by a substrate 102. The magnetic cell core 100 includes at least two magnetic regions, for example, a "fixed region" 110 and a "free region" 120 with a nonmagnetic region 130 in between. One or more lower intermediary regions 140 and one or more upper intermediary regions 150 may, optionally, be disposed under and over, respectively, the magnetic regions (e.g., the fixed region 110 and the free region 120) of the magnetic cell core 100 structure.

In some embodiments, as illustrated in FIG. 1, the magnetic cell core 100 may include an optional conductive material forming a seed region 160 on the substrate 102. The seed region 160, if present, or the lower intermediary regions 140, if the seed region 160 is not present, may be formed over a bottom conductive material (not shown), which may include, for example and without limitation, copper, tungsten, titanium, or a combination thereof. The seed region 160, if present, may include, for example and without limitation, a nickel-based material and may be configured to control the crystal structure of an overlying material or region. The lower intermediary regions 140, if present, may include materials configured to ensure a desired crystal structure of overlying materials in the magnetic cell core 100.

The STT-MRAM cell may be configured to exhibit a vertical magnetic orientation in at least one of the magnetic regions (e.g., the fixed region 110 and the free region 120). The vertical magnetic orientation exhibited may be characterized by the perpendicular magnetic anisotropy ("PMA") strength. As illustrated in FIG. 1 by arrows 112 and 122, in some embodiments, each of the fixed region 110 and the free region 120 may exhibit a vertical magnetic orientation. The magnetic orientation of the fixed region 110 may remain directed in essentially the same direction throughout operation of the STT-MRAM cell, for example, in the direction indicated by arrows 112 of FIG. 1. The magnetic orientation of the free region 120, on the other hand, may be switched, during operation of the cell, between a "parallel" configuration and an "anti-parallel" configuration, as indicated by double-pointed arrows 122 of FIG. 1. In the parallel orientation, the magnetic orientation 122 of the free region 120 is directed in essentially the same direction (e.g., north) as the magnetic orientation 112 of the fixed region 110 (e.g., north), producing a lower electrical resistance across the magnetoresistive elements, i.e., the fixed region 110 and the free region 120, in what may be defined as the "0" state of the STT-MRAM cell. In the anti-parallel configuration, the magnetic orientation 122 of the free region 120 is directed essentially in the opposite direction (e.g., south) of the magnetic orientation 112 of the fixed region 110 (e.g. north), producing a higher electrical resistance across the magnetoresistive elements, i.e., the fixed region 110 and the free region 120, in what may be defined as the "1" state of the STT-MRAM cell.

In use and operation, a programming current may be caused to flow through an access transistor (not shown) and the magnetic cell core 100. The fixed region 110 within the magnetic cell core 100 polarizes the electron spin of the programming current. The spin-polarized electron current interacts with the free region 120 by exerting a torque on the free region 120. When the torque of the spin-polarized electron current passing through the free region 120 is greater than a critical switching current density ($J_c$) of the free region 120, the torque exerted by the spin-polarized electron current is sufficient to switch the direction of the magnetization of the free region 120, e.g., between a north-directed magnetic orientation and a south-directed magnetic orientation. Thus, the programming current can be used to cause the magnetic orientation 122 of the free region 120 to be aligned either parallel to or anti-parallel to the magnetic orientation 112 of the fixed region 110.

The free region 120 and the fixed region 110 may be formed from or comprise ferromagnetic materials, such as Co, Fe, Ni, or their alloys, NiFe, CoFe, CoNiFe, or doped alloys CoX, CoFeX, CoNiFeX (X=B, Cu, Re, Ru, Rh, Hf, Pd, Pt, C), or other half-metallic ferromagnetic materials, such as, for example, NiMnSb and PtMnSb. In some embodiments, for example, the free region 120, the fixed region 110, or both may be formed from $Co_xFe_yB_z$, wherein x=10 to 80, y=10 to 80, and z=0 to 50. In other embodiments, the free region 120, the fixed region 110, or both may be formed of iron (Fe) and boron (B) and not include cobalt (Co). The compositions and structures (e.g., the thicknesses and other physical dimensions) of the free region 120 and the fixed region 110 may be the same or different.

Alternatively or additionally, in some embodiments, the free region 120, the fixed region 110, or both, may be formed from or comprise a plurality of materials, some of which may be magnetic materials and some of which may be nonmagnetic materials. For example, some such multi-material free regions, fixed regions, or both, may include multiple sub-regions. For example, and without limitation, the free region 120, the fixed region 110, or both, may be formed from or comprise repeating sub-regions of cobalt and platinum, wherein a sub-region of platinum may be disposed between sub-regions of cobalt. As another example, without limitation, the free region 120, the fixed region 110, or both, may comprise repeating sub-regions of cobalt and nickel, wherein a sub-region of nickel may be disposed between sub-regions of cobalt.

The nonmagnetic region 130, disposed between the fixed region 110 and the free region 120, may include nonmagnetic materials (such as a nonmagnetic oxide material, e.g., magnesium oxide (MgO), aluminum oxide ($Al_2O_3$), titanium oxide ($TiO_2$), or other oxide materials of conventional MTJ regions). Accordingly, such oxide-including MTJ region may be referred to herein as an "oxide-based MTJ region" or an "oxide-based nonmagnetic region." The nonmagnetic region 130 may include one or more such nonmagnetic materials. Alternatively or additionally, the nonmagnetic region 130 may include sub-regions of one or more nonmagnetic materials.

As illustrated in FIG. 1, the magnetic cell core 100 may, in some embodiments, include an oxide capping region 170, which may include oxides such as MgO, $TiO_2$, tantalum pentoxide ($Ta_2O_5$), or combinations thereof. Accordingly, such oxide-including capping region may be referred to herein, also, as an "oxide-based nonmagnetic region." In some embodiments, the oxide capping region 170 may include the same materials, structure, or both of the nonmagnetic region 130. For example, the oxide capping region 170 and the nonmagnetic region 130 may both include a magnesium oxide (e.g., MgO), an aluminum oxide, a titanium oxide, a zinc oxide, hafnium oxide, a ruthenium oxide, or a tantalum oxide.

The optional upper intermediary regions 150, if present, may include materials configured to ensure a desired crystal structure in neighboring materials of the magnetic cell core 100. The upper intermediary regions 150 may alternatively or additionally include metal materials configured to aid in patterning processes during fabrication of the magnetic cell core 100, barrier materials, or other materials of conventional STT-MRAM cell core structures. In some embodiments, such as that illustrated in FIG. 1, the upper intermediary regions 150 may include a conductive capping region, which may include one or more materials such as copper, tantalum, titanium, tungsten, ruthenium, tantalum nitride, or titanium nitride.

The magnetic cell core 100, according to the present disclosure, also includes a magnetic interface region 180 disposed between one of the magnetic regions or magnetic sub-regions (e.g., the fixed region 110, a magnetic sub-region of the fixed region 110, the free region 120, or a magnetic sub-region of the free region 120) and one of the oxide regions (e.g., the nonmagnetic region 130 and the oxide capping region 170). As illustrated in FIG. 1, the magnetic interface region 180 may be disposed directly adjacent to one of the magnetic regions or magnetic sub-regions and one of the oxide regions. According to the embodiment illustrated in FIG. 1, the magnetic interface region 180 may be disposed directly on top of the nonmagnetic region 130 and directly beneath the free region 120. As situated, the magnetic interface region 180 may be disposed between two oxide regions, i.e., between an oxide-based MTJ (e.g., the nonmagnetic region 130) and the oxide capping region 170.

The magnetic interface region 180 may be configured to enhance the PMA strength of the magnetic cell core 100, or, more particularly, of its neighboring magnetic region, e.g., the free region 120 according to the embodiment illustrated in FIG. 1. The increased PMA may be achieved while maintaining a low resistance-area (e.g., less than about 20 $\Omega \cdot \mu m^2$ (Ohms×microns squared)) of the magnetic cell core 100. The magnetic interface region 180 may be formed of a magnetic material, such as an iron-based material, e.g., iron (Fe) alone, an iron alloy, or, in some embodiments, a cobalt-iron (CoFe) based material.

The material of the magnetic interface region 180 may be in the form of a monolayer of iron or other iron-including compound disposed between the nonmagnetic region 130 and the oxide capping region 170. Alternatively or additionally, the magnetic interface region 180 may have a thickness (i.e., a height along an axis perpendicular to an upper surface of the substrate 102) that is less than about 10 Å (e.g., less than about 5 Å, e.g., about 3 Å). As such, the magnetic interface region 180 may be thinner than its neighboring regions. For example, the overlying free region 120 of FIG. 1 may be formed to have a thickness of about 15 Å to about 30 Å, and the underlying nonmagnetic region 130 of FIG. 1 may be formed to have a thickness of about 7 Å to about 10 Å.

The magnetic interface region 180 may be formed from a material formulated or otherwise configured to have the same crystal orientation as that of the material upon which it is formed. For example, according to the embodiment illustrated in FIG. 1, the magnetic interface region 180 may be formed from iron (Fe) in such a manner (e.g., by magnetron sputtering) as to have the same crystal orientation as MgO within the nonmagnetic region 130.

The magnetic interface region 180 may be formed by, e.g., magnetron sputtering. For example, the materials of the lower regions of the magnetic cell core 100 may be formed successively, such as in layers, following which the magnetic material of the magnetic interface region 180 may be formed over the previously-formed materials. The materials of the upper regions of the magnetic cell core 100 may then be formed successively, such as in layers, above the magnetic material of the magnetic interface region 180. Accordingly, the material of the magnetic interface region 180 may be formed so as to be disposed between two oxide-based materials, i.e., the oxide materials from which the nonmagnetic region 130 and the oxide capping region 170 are to be formed.

Following formation of the materials of the magnetic cell core 100, the materials may be patterned to form the magnetic cell core 100 comprising the various regions thereof. Techniques for forming and patterning the materials of the lower and upper regions of the magnetic cell core 100 are known in the art and, therefore, are not described in detail herein. For example, the magnetic cell core 100 may be formed by forming each of the materials of the regions thereof in sequential order, from base to top, and then patterning the materials to define the magnetic cell core 100. The magnetic cell core 100 structure may be annealed at a temperature of at least 150° C. (e.g., between about 150° C. and about 400° C.) before or after patterning. Alternatively or additionally, materials of the magnetic cell core 100 structure may be annealed during fabrication of the magnetic cell core 100 structure, e.g., after formation of one or more materials of the magnetic cell core 100 structure and before other materials thereof are formed.

In embodiments such as that illustrated in FIG. 1, in which the magnetic interface region 180 is disposed directly between the nonmagnetic region 130 and the free region 120, and in which the magnetic interface region 180 is disposed between the nonmagnetic region 130 and the oxide capping region 170, it is contemplated that, without being bound to any one particular theory, the magnetic interface region 180 enables iron-oxygen bonding between iron in the magnetic interface region 180 and oxygen in the oxide material of the neighboring oxide-based region, e.g., the nonmagnetic region 130. Iron-oxygen bonding may contribute to interfacial PMA strength. It is contemplated that the contribution to interfacial PMA strength by iron-oxygen bonding may be greater than a contribution from other oxygen bonding, such as cobalt-oxygen bonding. Accordingly, the inclusion of the magnetic interface region 180 in the magnetic cell core 100 may enable a stronger PMA than that achieved by a magnetic cell core structure lacking a magnetic interface region 180 between a magnetic region such as the free region 120 and an oxide region such as the nonmagnetic region 130.

Accordingly, disclosed is a memory cell comprising a magnetic cell core on a substrate. The magnetic cell core comprises a magnetic region between an oxide region and another oxide region. The magnetic region exhibits a vertical magnetic orientation. A magnetic interface region is disposed between the oxide region and the another oxide region.

Figure 2:
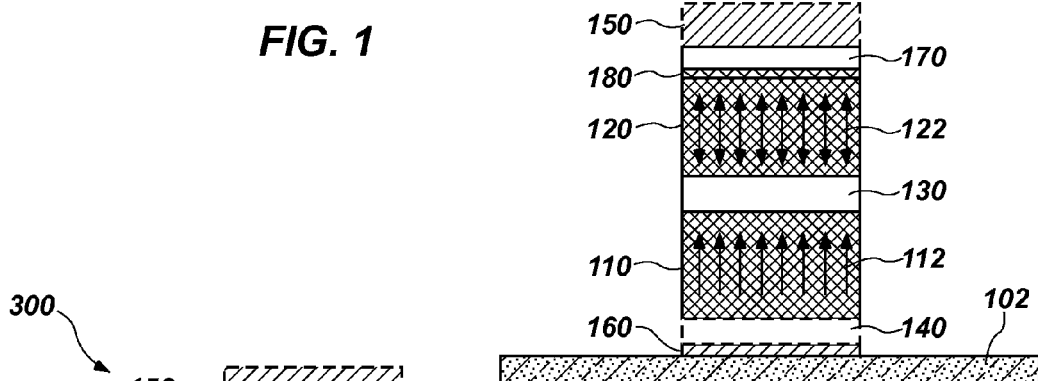
FIG. 2 is a cross-sectional, elevational, schematic illustration of a magnetic cell core of an STT-MRAM cell including a magnetic interface region disposed directly between a free region and an oxide cap region.

With reference to FIG. 2, illustrated is a magnetic cell core 200 in which the magnetic interface region 180 is disposed between the nonmagnetic region 130 and the oxide capping region 170, but above the free region 120. Thus, the nonmagnetic region 130 is disposed to one side of, e.g., underneath, the free region 120 while the magnetic interface region 180 is disposed to another side of, e.g., above, the free region 120. The materials of the magnetic cell core 200 may be the same as those of the magnetic cell core 100 (FIG. 1) described above. The magnetic cell core 200 may be formed by forming each of the materials of the regions thereof in sequential order, from base to top, and then patterning the materials to define the magnetic cell core 200 structure. Thus, the magnetic interface region 180 may be formed directly on the free region 120, and the oxide capping region 170 may be formed directly on the magnetic interface region 180. In other embodiments (not shown in FIG. 2), the positions of the free region 120 and the fixed region 110 may be interchanged such that the magnetic interface region 180 would be disposed between the oxide capping region 170 and the fixed region 110, which would be positioned above the nonmagnetic region 130.

Accordingly, disclosed is a method of forming a memory cell, the method comprising forming an oxide material over a substrate. A magnetic material is formed over the oxide material. Another oxide material is formed over the magnetic material. An iron-based material is formed between the magnetic material and one of the oxide material and the another oxide material. The oxide material, the magnetic material, the another oxide material, and the iron-based material are patterned to form a magnetic cell core comprising a tunnel junction region from the oxide material, one of a free region and a fixed region from the magnetic material, a magnetic interface region from the iron-based material, and an oxide capping region from the another oxide material. The magnetic material exhibits a vertical magnetic orientation.

Figure 3:
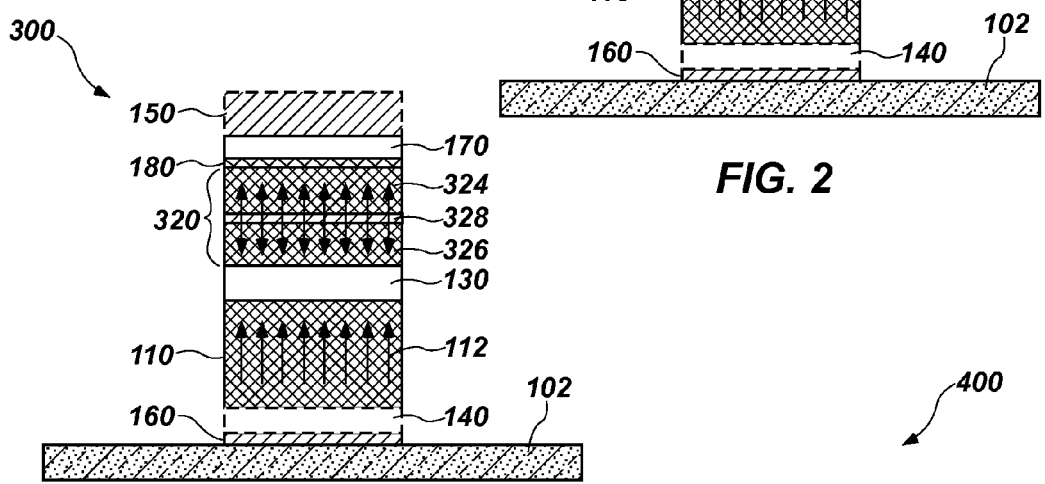
FIG. 3 is a cross-sectional, elevational, schematic illustration of a magnetic cell core of an STT-MRAM cell including a magnetic interface region disposed directly between a magnetic sub-region of a free region and an oxide cap region.

With reference to FIG. 3, in some embodiments, a magnetic cell core 300 according to the present disclosure may include magnetic regions, such as the free region, the fixed region, or both, having a multi-material structure. For example, the fixed region 110 of the embodiment of FIG. 3, or any of the preceding or following described embodiments, may be configured as an SAF with a Ru sub-region neighbored on top and bottom by a magnetic sub-region. As another example, as illustrated, the magnetic cell core 300 may include a multi-material free region 320. The multi-material free region 320 may include an upper magnetic sub-region 324 spaced from (i.e., not directly in physical contact with) a lower magnetic sub-region 326 by a spacer 328. In other embodiments, the multi-material free region 320 may lack the spacer 328. In still other embodiments, the multi-material free region 320 may have more than two magnetic sub-regions, more than one spacer 328, or both.

The material or materials from which the upper magnetic sub-region 324 and the lower magnetic sub-region 326 are formed may be the same material or materials, respectively, from which the free region 120 may be formed, as described above. For example, and without limitation, each of the upper magnetic sub-region 324 and the lower magnetic sub-region 326 may be formed from $Co_xFe_yB_z$, wherein x=1, y=50 to 60, and z=1 to 30, e.g., $CoFe_{50}B_{30}$. As another example, the upper magnetic sub-region 324 may be formed of $CoFeB_{60}$ while the lower magnetic sub-region 326 may be formed of $CoFe_{50}B_{30}$.

Each of the upper magnetic sub-region 324 and the lower magnetic sub-region 326 may be formed to each be thicker than the spacer 328. In some embodiments, the lower magnetic sub-region 326 may have a thickness of about 10 Å, and the upper magnetic sub-region 324 may have a thickness of about 6 Å. In other embodiments, the upper magnetic sub-region 324 and the lower magnetic sub-region 326 may be formed to have approximately equal thicknesses, e.g., from about 6 Å to about 10 Å.

The spacer 328 may be formed from a conductive material such as, for example and without limitation, tantalum (Ta). The spacer 328 may be relatively thin compared to the overlying and underlying sub-regions. For example, the spacer 328 may have a thickness of less than about 3 Å, e.g., about 1.5 Å.

The multi-material free region 320 may be formed by forming each of the materials thereof sequentially, from base to top, before the materials are patterned to form the magnetic cell core 300.

According to the embodiment of FIG. 3, the magnetic interface region 180 may be formed over the multi-material free region 320, so as to be disposed between the nonmagnetic region 130 and the oxide capping region 170. Thus, the magnetic interface region 180 may be directly between the upper magnetic sub-region 324 and the oxide capping region 170.

Accordingly, disclosed is a memory cell comprising a magnetic cell core comprising a free region configured to exhibit a switchable vertical magnetic orientation and a fixed region configured to exhibit a fixed vertical magnetic orientation. A nonmagnetic region is disposed between the free region and the fixed region. A magnetic interface region is spaced from the nonmagnetic region by one of the free region and the fixed region.

Figure 4:
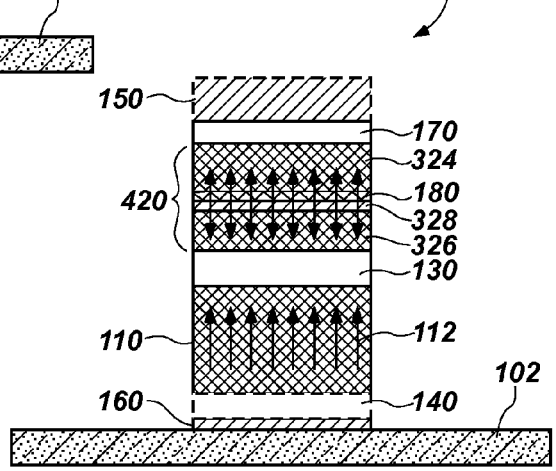
FIG. 4 is a cross-sectional, elevational, schematic illustration of a magnetic cell core of an STT-MRAM cell including a magnetic interface region disposed within a free region.

With reference to FIG. 4, a magnetic cell core 400, according to the present disclosure, having a multi-material free region 420 comprising the upper magnetic sub-region 324, the lower magnetic sub-region 326, and the spacer 328, may be structured to also comprise the magnetic interface region 180. That is, the magnetic interface region 180 may be disposed directly adjacent to, either above or below, the spacer 328 and one of the upper magnetic sub-region 324 and the lower magnetic sub-region 326. In this structure, the magnetic interface region 180 is spaced from both of the oxide-based regions, i.e., the nonmagnetic region 130 and the oxide capping region 170. Nonetheless, the presence of the magnetic interface region 180 may enhance the PMA strength of at least the magnetic region incorporating the magnetic interface region 180, which, as illustrated in FIG. 4, may be the free region (e.g., the multi-material free region 420). For example, the PMA strength of the magnetic region (e.g., the multi-material free region 420) may be greater than about 4,000 Oersted (e.g., greater than about 5,000 Oersted).

In a structure such as that of the magnetic cell core 400 of FIG. 4, the upper magnetic sub-region 324 and the lower magnetic sub-region 326 may be of the same thicknesses. Alternatively, the total thickness of the magnetic interface region 180 and the one of the upper magnetic sub-region 324 and the lower magnetic sub-region 326 to which the magnetic interface region 180 is adjacent may be about equal to the thickness of the other of the upper magnetic sub-region 324 and the lower magnetic sub-region 326. For example, the lower magnetic sub-region 326 may have a thickness of about 10 Å, while the upper magnetic sub-region 324 may have a thickness of about 6 Å and the magnetic interface region 180 may have a thickness of about 4 Å.

The materials of the multi-material free region 420 may be formed sequentially, from base to top, whereby the magnetic interface region 180 may be formed directly on the spacer 328, and the upper magnetic sub-region 324 may be formed directly on the magnetic interface region 180.

Figure 5:
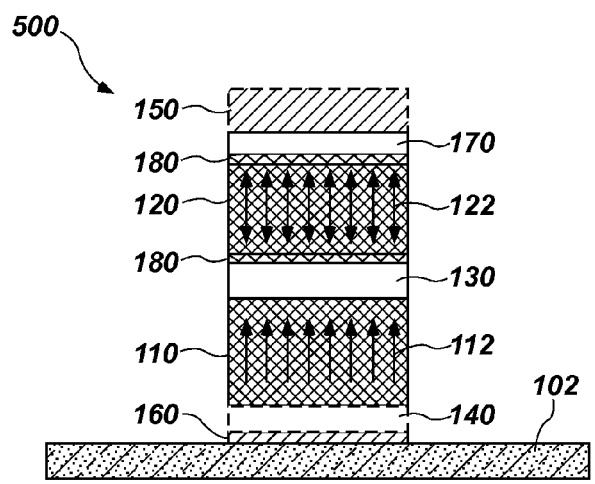
FIG. 5 is a cross-sectional, elevational, schematic illustration of a magnetic cell core of an STT-MRAM cell including two magnetic interface regions, one of which being disposed directly between a free region and an oxide cap region and another being disposed directly between the free region and a magnetic tunnel junction region.

With reference to FIG. 5, a magnetic cell core 500 according to the present disclosure may, alternatively, include more than one magnetic interface region 180. For example, as illustrated in FIG. 5, a pair of magnetic interface regions 180 may be disposed such that one overlies one of the magnetic regions of the magnetic cell core 500, e.g., overlies the free region 120, while another magnetic interface region 180 of the pair underlies the same magnetic region, e.g., underlies the free region 120. Again, the materials of the magnetic cell core 500 may be formed sequentially, from base to top, and may be patterned to form the magnetic cell core 500.

Figure 6:
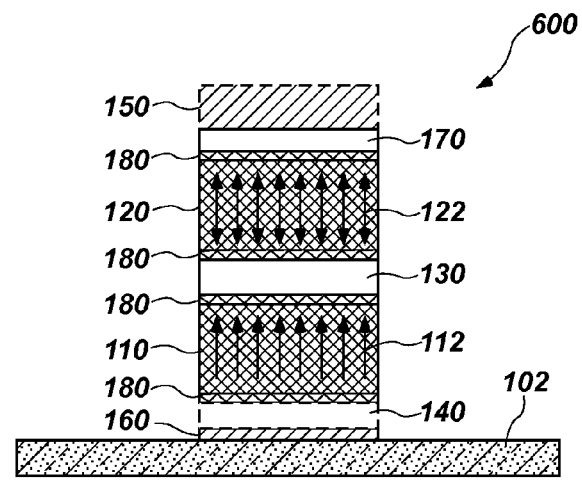
FIG. 6 is a cross-sectional, elevational, schematic illustration of a magnetic cell core of an STT-MRAM cell including four magnetic interface regions, of which one pair is disposed on top and on bottom of a free region and another pair is disposed on top and on bottom of a fixed region.

With reference to FIG. 6, in some embodiments a magnetic cell core 600 may include more than two magnetic interface regions 180, such as one magnetic interface region 180 directly on each of the top and bottom of each of the magnetic regions (e.g., the free region 120 and the fixed region 110) of the magnetic cell core 600. Again, the materials of the magnetic cell core 600 may be formed sequentially, from base to top, and may be thereafter patterned to form the magnetic cell core 600.

Figure 7:
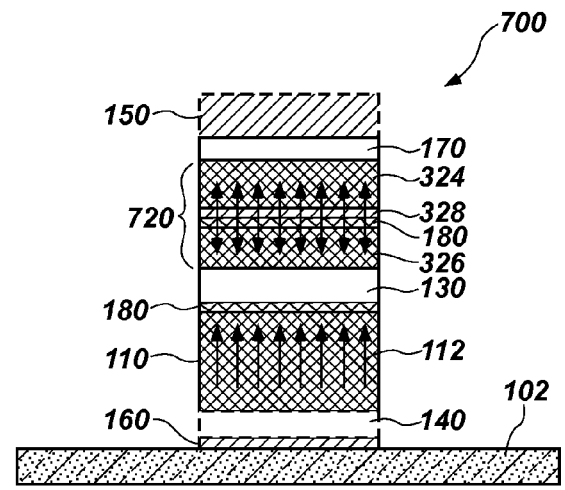
FIG. 7 is a cross-sectional, elevational, schematic illustration of a magnetic cell core of an STT-MRAM cell including one magnetic interface region within a free region and another magnetic interface region on top of a fixed region.

With reference to FIG. 7, it is contemplated that one of the magnetic regions of a magnetic cell core 700, such as the free region or, for example, a multi-material free region 720 may incorporate the magnetic interface region 180 while another magnetic region of the magnetic cell core 700, such as the fixed region 110 may be adjacent to another magnetic interface region 180. Again, the materials of such magnetic cell core 700 may be formed sequentially, from base to top.

Accordingly, the number of magnetic interface regions 180 and the disposition of such magnetic interface regions 180 may be tailored according to the desired STT-MRAM structure and operability. Likewise, the exact composition and thickness of the magnetic interface region 180 may be tailored to achieve a desired PMA strength, which may be the highest PMA strength (e.g., $H_k$ (Oe)) achievable without adversely impacting the operation of the STT-MRAM cell. It is contemplated that the thickness of the magnetic interface region 180 may be optimized, through testing, to be of a thickness great enough to enhance the PMA strength while less than the thickness that would negatively impact the operation characteristics of the STT-MRAM cell.

In embodiments in which multiple magnetic interface regions 180 are included in the magnetic cell core (e.g., magnetic cell cores 500, 600, or 700), the magnetic interface regions 180 within the magnetic cell cores 500, 600, or 700 may have equal thicknesses or, alternatively, the thicknesses of the magnetic interface regions 180 may vary from one another. Again, it is contemplated that the relative thicknesses of the multiple magnetic interface regions 180 may be optimized, through testing.

Following formation of the magnetic cell core (e.g., one of magnetic cell cores 100-700), the semiconductor device structure may be subjected to additional fabrication steps, as known in the art, to form an operational semiconductor device, such as an STT-MRAM cell, an array of STT-MRAM cells, an STT-MRAM system, a processor-based system, or any combination thereof.

Figure 8:
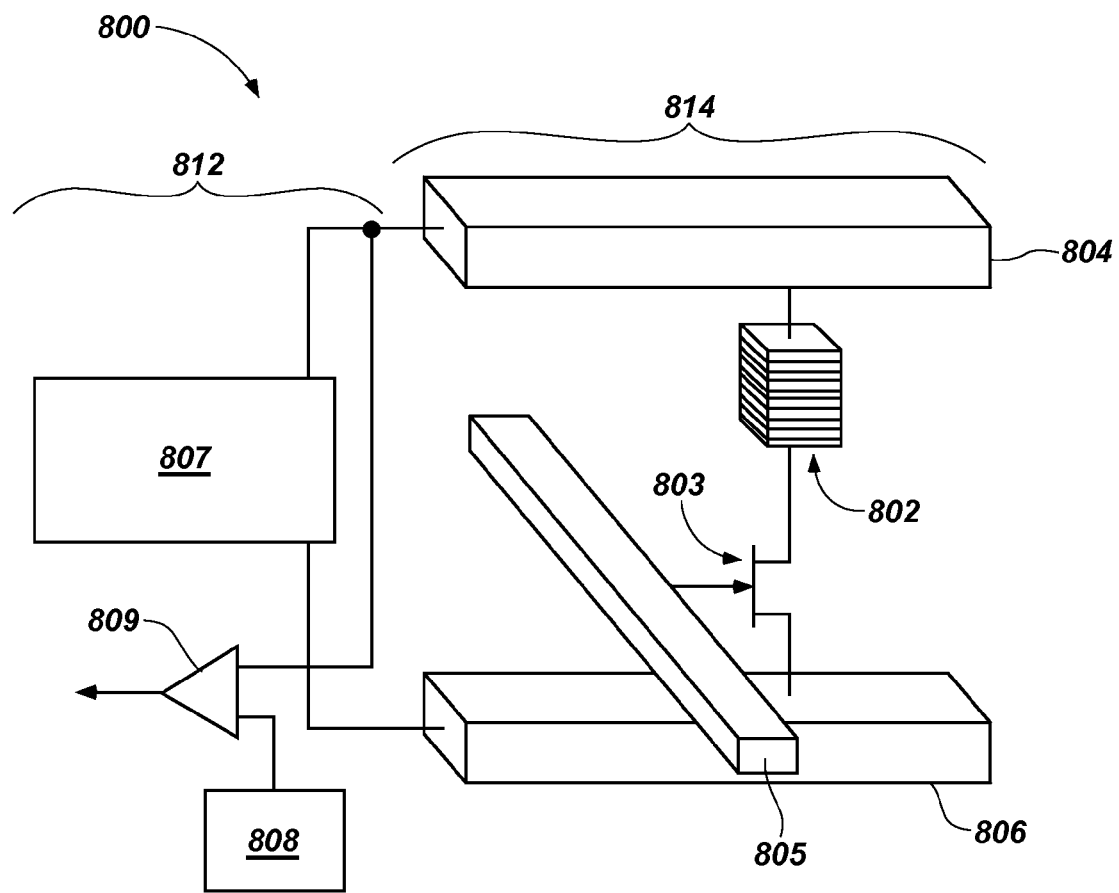
FIG. 8 is a schematic diagram of an STT-MRAM system having a memory cell according to an embodiment of the present disclosure.

With reference to FIG. 8, illustrated is an STT-MRAM system 800 that includes peripheral devices 812 in operable communication with an STT-MRAM cell 814, a plurality of which may be fabricated to form an array of memory cells in a grid pattern including a number of rows and columns, or in various other arrangements, depending on the system requirements and fabrication technology. The STT-MRAM cell 814 includes a cell core 802, an access transistor 803, a conductive material that may function as a data/sense line 804 (e.g., a bit line), a conductive material that may function as an access line 805 (e.g., a word line), and a conductive material that may function as a source line 806. The peripheral devices 812 of the STT-MRAM system 800 may include read/write circuitry 807, a bit line reference 808, and a sense amplifier 809. The cell core 802 may be any one of the magnetic cell cores 100-700 described above. Due to the structure of the cell core 802, i.e., the inclusion of the magnetic interface region 180 (FIGS. 1-7) that is spaced from the nonmagnetic region 130, e.g., the tunnel region or MTJ, or from the oxide capping region 170 and the resultant enhancement of the PMA strength of the STT-MRAM cell 814, the STT-MRAM cell 814 may exhibit a higher data retention time and operate effectively at lower power than a conventional STT-MRAM cell.

In use and operation, when an STT-MRAM cell 814 is selected to be programmed, a programming current is applied to the STT-MRAM cell 814, and the current is spin-polarized by the fixed region of the cell core 802 and exerts a torque on the free region of the cell core 802, which switches the magnetization of the free region to "write to" or "program" the STT-MRAM cell 814. In a read operation of the STT-MRAM cell 814, a current is used to detect the resistance state of the cell core 802.

To initiate programming of the STT-MRAM cell 814, the read/write circuitry 807 may generate a write current to the data/sense line 804 and the source line 806. The polarity of the voltage between the data/sense line 804 and the source line 806 determines the switch in magnetic orientation of the free region in the cell core 802. By changing the magnetic orientation of the free region with the spin polarity, the free region is magnetized according to the spin polarity of the programming current, the programmed state is written to the STT-MRAM cell 814.

To read the STT-MRAM cell 814, the read/write circuitry 807 generates a read voltage to the data/sense line 804 and the source line 806 through the cell core 802 and the access transistor 803. The programmed state of the STT-MRAM cell 814 relates to the resistance across the cell core 802, which may be determined by the voltage difference between the data/sense line 804 and the source line 806. In some embodiments, the voltage difference may be compared to the bit line reference 808 and amplified by the sense amplifier 809.

FIG. 8 illustrates one example of an operable STT-MRAM system 800. It is contemplated, however, that the magnetic cell cores 100-700 (FIGS. 1-7) may be incorporated and utilized within any STT-MRAM system configured to incorporate a magnetic cell core having magnetic regions exhibiting vertical magnetic orientations. Notably, because the thickness of the magnetic interface region 180 (FIGS. 1-7) may be relatively thin, relative to other regions of the magnetic cell cores 100-700, the total height of the magnetic cell cores 100-700 may be the same or not much greater than the height of a conventional magnetic cell core of an STT-MRAM cell. Further, because the magnetic interface region 180 may be formed using techniques the same as or similar to techniques used to form other regions of the magnetic cell cores 100-700, the overall fabrication process may not be significantly altered to accomplish formation of the magnetic cell cores 100-700 in accordance with embodiments of the present disclosure.

Accordingly, disclosed is a spin torque transfer magnetic random access memory (STT-MRAM) system comprising a magnetic cell core comprising a magnetic interface region on or in a magnetic region. The magnetic region is configured to exhibit a vertical magnetic orientation. An oxide region is spaced from the magnetic interface region. The STT-MRAM system also comprises a plurality of conductive materials in operable communication with the magnetic cell core.

Figure 9:
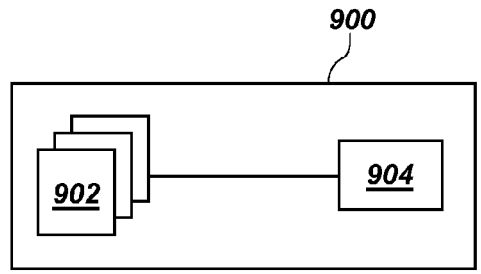
FIG. 9 is a simplified block diagram of a semiconductor device structure including memory cells of an embodiment of the present disclosure.

With reference to FIG. 9, illustrated is a simplified block diagram of a semiconductor device structure 900 implemented according to one or more embodiments described herein. The semiconductor device structure 900 includes a memory array 902 and a control logic component 904. The memory array 902 may include a plurality of the STT-MRAM cells 814 (FIG. 8) including any of the magnetic cell cores 100-700 (FIGS. 1-7) discussed above, which magnetic cell cores 100-700 (FIGS. 1-7) may have been formed according to a method described above. The control logic component 904 may be configured to operatively interact with the memory array 902 so as to read from or write to any or all memory cells (e.g., STT-MRAM cell 814) within the memory array 902.

Accordingly, disclosed is a semiconductor device structure comprising a spin torque transfer magnetic random access memory (STT-MRAM) array comprising a plurality of STT-MRAM cells. Each STT-MRAM cell of the plurality comprises a cell core comprising a nonmagnetic region between a magnetic region and another magnetic region. Each of the magnetic region and the another magnetic region are configured to exhibit a vertical magnetic orientation. An oxide region is spaced from the nonmagnetic region by one of the magnetic region and the another magnetic region. A magnetic interface region is disposed between the oxide region and the nonmagnetic region.

Figure 10:
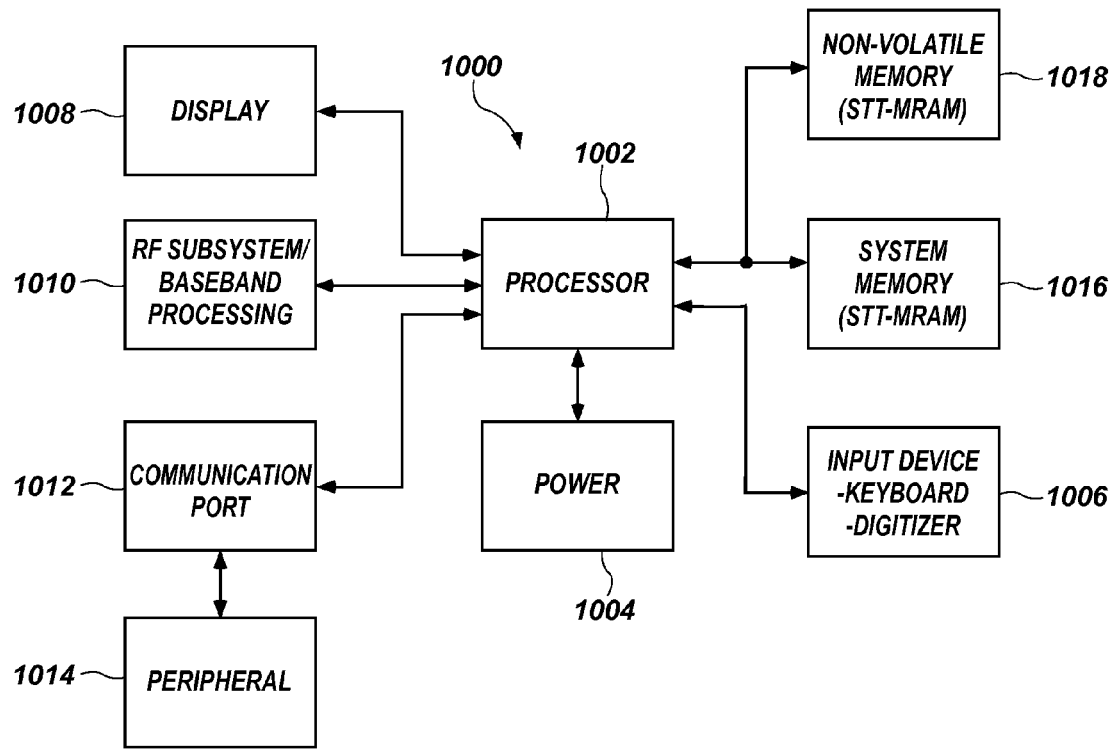
FIG. 10 is a simplified block diagram of a system implemented according to one or more embodiments of the present disclosure.

With reference to FIG. 10, depicted is a processor-based system 1000. The processor-based system 1000 may include various electronic devices manufactured in accordance with embodiments of the present disclosure. The processor-based system 1000 may be any of a variety of types such as a computer, pager, cellular phone, personal organizer, control circuit, or other electronic device. The processor-based system 1000 may include one or more processors 1002, such as a microprocessor, to control the processing of system functions and requests in the processor-based system 1000. The processor 1002 and other subcomponents of the processor-based system 1000 may include magnetic memory devices manufactured in accordance with embodiments of the present disclosure.

The processor-based system 1000 may include a power supply 1004. For example, if the processor-based system 1000 is a portable system, the power supply 1004 may include one or more of a fuel cell, a power scavenging device, permanent batteries, replaceable batteries, and rechargeable batteries. The power supply 1004 may also include an AC adapter; therefore, the processor-based system 1000 may be plugged into a wall outlet, for example. The power supply 1004 may also include a DC adapter such that the processor-based system 1000 may be plugged into a vehicle cigarette lighter or a vehicle power port, for example.

Various other devices may be coupled to the processor 1002 depending on the functions that the processor-based system 1000 performs. For example, a user interface 1006 may be coupled to the processor 1002. The user interface 1006 may include input devices such as buttons, switches, a keyboard, a light pen, a mouse, a digitizer and stylus, a touch screen, a voice recognition system, a microphone, or a combination thereof. A display 1008 may also be coupled to the processor 1002. The display 1008 may include an LCD display, an SED display, a CRT display, a DLP display, a plasma display, an OLED display, an LED display, a three-dimensional projection, an audio display, or a combination thereof. Furthermore, an RF sub-system/baseband processor 1010 may also be coupled to the processor 1002. The RF sub-system/baseband processor 1010 may include an antenna that is coupled to an RF receiver and to an RF transmitter (not shown). A communication port 1012, or more than one communication port 1012, may also be coupled to the processor 1002. The communication port 1012 may be adapted to be coupled to one or more peripheral devices 1014, such as a modem, a printer, a computer, a scanner, or a camera, or to a network, such as a local area network, remote area network, intranet, or the Internet, for example.

The processor 1002 may control the processor-based system 1000 by implementing software programs stored in the memory. The software programs may include an operating system, database software, drafting software, word processing software, media editing software, or media playing software, for example. The memory is operably coupled to the processor 1002 to store and facilitate execution of various programs. For example, the processor 1002 may be coupled to system memory 1016, which may include one or more of spin torque transfer magnetic random access memory (STT-MRAM), magnetic random access memory (MRAM), dynamic random access memory (DRAM), static random access memory (SRAM), racetrack memory, and other known memory types. The system memory 1016 may include volatile memory, non-volatile memory, or a combination thereof. The system memory 1016 is typically large so that it can store dynamically loaded applications and data. In some embodiments, the system memory 1016 may include semiconductor device structures, such as the semiconductor device structure 900 of FIG. 9, memory cells including any of magnetic cell cores 100-700 (FIGS. 1-7), or a combination thereof.

The processor 1002 may also be coupled to non-volatile memory 1018, which is not to suggest that system memory 1016 is necessarily volatile. The non-volatile memory 1018 may include one or more of STT-MRAM, MRAM, read-only memory (ROM) such as an EPROM, resistive read-only memory (RROM), and Flash memory to be used in conjunction with the system memory 1016. The size of the non-volatile memory 1018 is typically selected to be just large enough to store any necessary operating system, application programs, and fixed data. Additionally, the non-volatile memory 1018 may include a high capacity memory such as disk drive memory, such as a hybrid-drive including resistive memory or other types of non-volatile solid-state memory, for example. The non-volatile memory 1018 may include semiconductor device structures, such as the semiconductor device structure 900 of FIG. 9, memory cells including any of magnetic cell cores 100-700 (FIGS. 1-7), or a combination thereof.

The following example is presented to illustrate an embodiment of the present disclosure in more detail. This example is not to be construed as being exhaustive or exclusive as to the scope of this disclosure.

EXAMPLE

Figure 11:
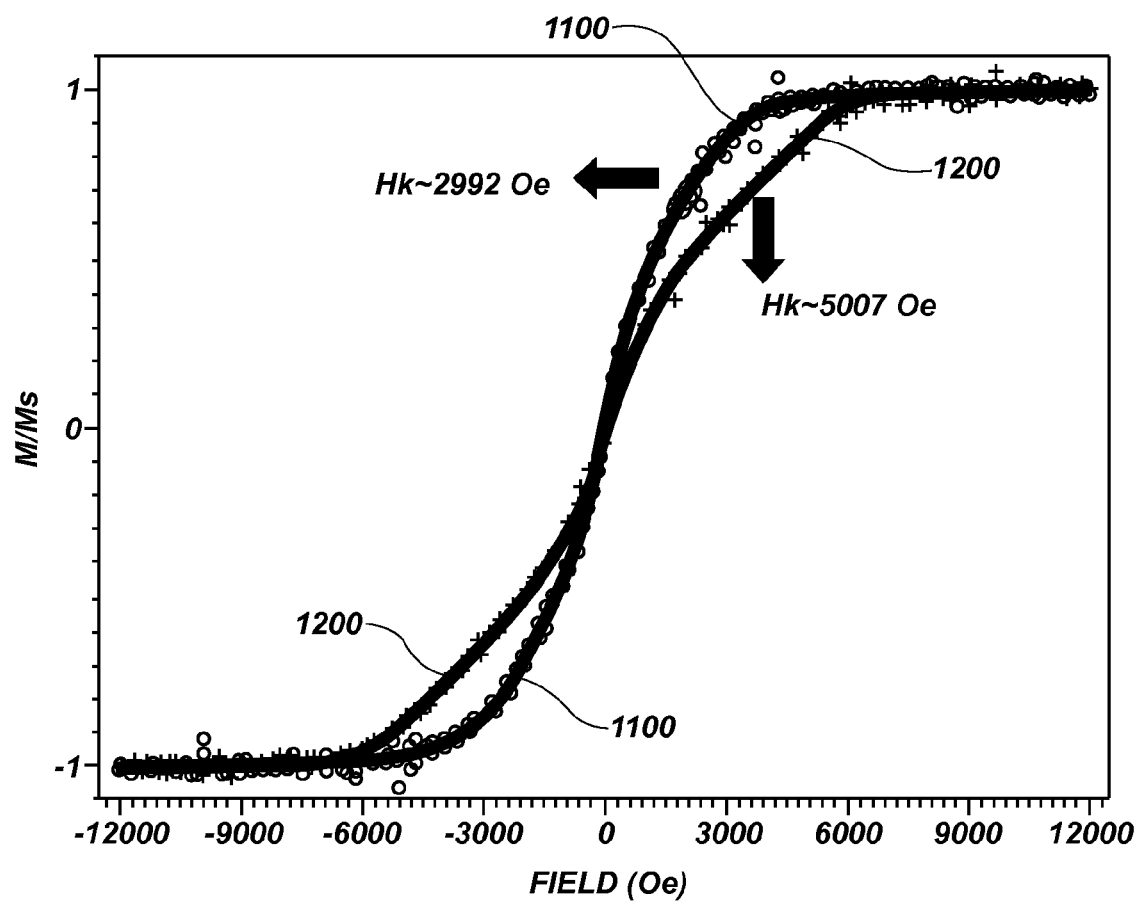
FIG. 11 is a graph displaying measurements of PMA strength for a magnetic cell core incorporating a magnetic interface region in comparison with a magnetic cell core lacking the magnetic interface region.

A partial magnetic cell core structure, without a magnetic contribution from a fixed region, was fabricated to evaluate the PMA strength of a free region fabricated according to an embodiment of the present disclosure. The partial magnetic cell core structure included a conductive seed region having a thickness of about 50 Å; an overlying dummy fixed region of CoFeB having a thickness of about 5 Å; an overlying non-magnetic region of MgO having a thickness of about 12 Å; an overlying multi-material free region comprising a lower magnetic sub-region of CoFeB having a thickness of about 10 Å, an overlying spacer of Ta having a thickness of about 1.5 Å, and an overlying upper magnetic sub-region of CoFeB, with slightly different B concentration than the lower magnetic sub-region, having a thickness of about 6 Å; an overlying magnetic interface region of Fe having a thickness of about 4 Å; an overlying oxide capping region of MgO having a thickness of about 7 Å; and an overlying upper conductive capping region having a thickness of about 500 Å. This partial magnetic cell core structure exhibited a PMA strength (measured by $H_k$(Oe)) of 5,007 Oe, as indicated by data line 1200 of FIG. 11. This compares to a PMA strength of 2,992 Oe, as indicated by data line 1100 of FIG. 11, exhibited by the same structure lacking the magnetic interface region of Fe. Accordingly, the magnetic cell core structure with the magnetic interface region disposed over the free region, adjacent to the oxide capping region, exhibited a more than 50% increase in PMA strength compared to the same structure without the magnetic interface region.

While the present disclosure is susceptible to various modifications and alternative forms in implementation thereof, specific embodiments have been shown by way of example in the drawings and have been described in detail herein. However, the present disclosure is not intended to be limited to the particular forms disclosed. Rather, the present disclosure encompasses all modifications, combinations, equivalents, variations, and alternatives falling within the scope of the present disclosure as defined by the following appended claims and their legal equivalents.

What is claimed is:

1. A memory cell comprising:
  a magnetic cell core on a substrate, the magnetic cell core comprising:
    a free region between an oxide region and another oxide region, the free region exhibiting a switchable, vertical magnetic orientation; and
    a magnetic interface region between the oxide region and the another oxide region, the magnetic interface region consisting of iron and defining a thickness of less than about ten angstroms, the magnetic interface region being thinner than regions of the magnetic cell core neighboring the magnetic interface region,
    the oxide region being an electrically insulative region disposed between and external to the free region and a fixed region exhibiting a fixed, vertical magnetic orientation, the oxide region spaced from the magnetic interface region.

2. The memory cell of claim 1, wherein the magnetic interface region is disposed directly between the free region and the another oxide region.

3. The memory cell of claim 1, wherein the fixed region is spaced from the free region by the oxide region.

4. The memory cell of claim 3, wherein the magnetic interface region is disposed above the free region and the fixed region.

5. The memory cell of claim 1, wherein the free region comprises iron and at least one of cobalt and boron.

6. The memory cell of claim 1, wherein the magnetic interface region is disposed within the free region.

7. The memory cell of claim 6, wherein the magnetic interface region is disposed between magnetic sub-regions of the free region.

8. The memory cell of claim 1, further comprising another magnetic interface region.

9. The memory cell of claim 1, wherein the free region exhibits a perpendicular magnetic anisotropy of greater than about 4,000 Oersted.

10. A memory cell comprising:
a magnetic cell core comprising:
a free region configured to exhibit a switchable vertical magnetic orientation;
a fixed region configured to exhibit a fixed vertical magnetic orientation;
a nonmagnetic region between the free region and the fixed region; and
a magnetic interface region spaced from the nonmagnetic region by one of the free region and the fixed region.

11. The memory cell of claim 10, wherein the nonmagnetic region comprises an oxide of magnesium, aluminum, or titanium.

12. The memory cell of claim 10, wherein the magnetic interface region has a thickness of about 3 Angstroms to about 4 Angstroms.

13. The memory cell of claim 10, wherein the magnetic cell core further comprises another magnetic interface region contacting at least one of the free region and the fixed region.

14. A method of forming a memory cell, the method comprising:
forming a magnetic material over a substrate;
forming an oxide material over the magnetic material;
forming another magnetic material over the oxide material;
forming another oxide material over the another magnetic material;
forming, by magnetron sputtering, a material consisting of iron, to a thickness of less than about ten angstroms, between the another magnetic material and one of the oxide material and the another oxide material but not in contact with the oxide material; and
patterning the magnetic material, the oxide material, the another magnetic material, the another oxide material, and the material consisting of the iron to form a magnetic cell core on the substrate, the magnetic cell core comprising:
a free region formed from one of the magnetic material and the another magnetic material;
a fixed region formed from another of the magnetic material and the another magnetic material;
an electrically insulating oxide region disposed between and external to the free region and the fixed region and formed from the oxide material;
a magnetic interface region formed from the material consisting of the iron; and
another oxide region disposed above the free region and the fixed region and formed from the another oxide material,
the free region disposed between the electrically insulating oxide region and the another oxide region,
the free region exhibiting a switchable, vertical magnetic orientation,
the fixed region exhibiting a fixed, vertical magnetic orientation,
the magnetic interface region disposed between the oxide region and the another oxide region, the magnetic interface region consisting of the iron and defining the thickness of less than about ten angstroms, the magnetic interface region being thinner than regions of the magnetic cell core neighboring the magnetic interface region,
the electrically insulating oxide region spaced from the magnetic interface region.

15. The method of claim 14, further comprising annealing the oxide material, the magnetic material, the another oxide material, and the material consisting of the iron.

16. A semiconductor device structure, comprising:
a spin torque transfer magnetic random access memory (STT-MRAM) array comprising:
a plurality of STT-MRAM cells, each STT-MRAM cell of the plurality comprising:
a cell core comprising:
an electrically insulative nonmagnetic region between a free region and a fixed region, each of the free region and the fixed region configured to exhibit a vertical magnetic orientation;
an oxide region spaced from the electrically insulative nonmagnetic region by one of the free region and the fixed region; and
a magnetic interface region between the oxide region and the electrically insulative nonmagnetic region, the magnetic interface region consisting of iron, not contacting the electrically insulative nonmagnetic region, and defining a thickness of less than about ten angstroms that is less than a thickness of the free region.

17. A spin torque transfer magnetic random access memory (STT-MRAM) system, comprising:
a magnetic cell core comprising:
a magnetic interface region of a thickness of less than about ten angstroms on or in a free region of a thickness of about fifteen angstroms to about thirty angstroms, the magnetic interface region consisting of iron, the free region configured to exhibit a switchable vertical magnetic orientation; and
an electrically insulative oxide region spaced from the magnetic interface region, the electrically insulative oxide region disposed between the free region and a fixed region, the fixed region exhibiting a fixed vertical magnetic orientation; and
a plurality of conductive materials in operable communication with the magnetic cell core.

* * * * *